(12) United States Patent
Sugiyama et al.

(10) Patent No.: US 11,017,982 B2
(45) Date of Patent: May 25, 2021

(54) COMPOSITE CHARGED PARTICLE BEAM APPARATUS AND CONTROL METHOD THEREOF

(71) Applicant: HITACHI HIGH-TECH SCIENCE CORPORATION, Tokyo (JP)

(72) Inventors: Yasuhiko Sugiyama, Tokyo (JP); Naoko Hirose, Tokyo (JP); Hiroshi Oba, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 16/785,362

(22) Filed: Feb. 7, 2020

(65) Prior Publication Data

US 2020/0266029 A1   Aug. 20, 2020

(30) Foreign Application Priority Data

Feb. 15, 2019   (JP) .............................. JP2019-025928

(51) Int. Cl.
*H01J 37/248* (2006.01)
*H01J 37/28* (2006.01)
*H01J 37/08* (2006.01)

(52) U.S. Cl.
CPC ............ *H01J 37/248* (2013.01); *H01J 37/08* (2013.01); *H01J 37/28* (2013.01); *H01J 2237/31749* (2013.01)

(58) Field of Classification Search
CPC .. H01J 37/02; H01J 37/04; H01J 37/08; H01J 37/248; H01J 37/141; H01J 37/147; H01J 37/15

USPC ....................................................... 250/492.3
See application file for complete search history.

(56) References Cited

U.S. PATENT DOCUMENTS

| 2009/0242757 A1* | 10/2009 | Ogawa | ..................... H01J 37/28 250/306 |
| 2016/0217967 A1* | 7/2016 | Dohi | ................... H01J 37/1472 |

FOREIGN PATENT DOCUMENTS

| JP | H10106474 A | 4/1998 |
| JP | H11223588 A | 8/1999 |
| JP | 2000173520 A | 6/2000 |
| JP | 2006236836 A | 9/2006 |
| JP | 2007103108 A | 4/2007 |
| JP | 2007193977 A | 8/2007 |
| JP | 2009272293 A | 11/2009 |
| JP | 2013196826 A | 9/2013 |

\* cited by examiner

*Primary Examiner* — Jason L McCormack
(74) *Attorney, Agent, or Firm* — Holland & Hart LLP (57) ABSTRACT

Disclosed is a composite charged particle beam apparatus including: an ion supply unit supplying an ion beam; an acceleration voltage application unit applying an acceleration voltage to the ion beam supplied by the ion supply unit to accelerate the ion beam; a first focusing unit focusing the ion beam; a beam booster voltage application unit applying a beam booster voltage to the ion beam; a second focusing unit focusing the ion beam to irradiate a sample; an electron beam emission unit emitting an electron beam to irradiate the sample; and a controller setting a value of the beam booster voltage that the beam booster voltage application unit applies to the ion beam, based on a value of the acceleration voltage applied to the ion beam by the acceleration voltage application unit and of a set value predetermined according to a focal distance of the focused ion beam.

5 Claims, 9 Drawing Sheets

COMPOSITE CHARGED PARTICLE BEAM APPARATUS AND CONTROL METHOD THEREOF

CROSS REFERENCE TO RELATED APPLICATION

This application claims the benefit of Japanese Patent Application No. 2019-025928, filed Feb. 15, 2019, which is hereby incorporated by reference in its entirety into this application.

BACKGROUND OF THE INVENTION

1. Technical Field

The present invention relates to a composite charged particle beam apparatus and a control method thereof.

2. Description of the Related Art

In processing of a sample shape which is represented as production of a transmission electron microscope (TEM) sample using a composite charged particle beam apparatus having an electron beam (EB) and a focused ion beam (FIB), there is a need to limit damage to the sample caused by ion beam irradiation to a minimum. Because of this, in processing using the composite charged particle beam apparatus, the sample is processed with the acceleration energy of the ion beam lowered to several keV or less.

For example, a TEM lamella preparation method using a focused ion beam in which rough processing is performed at 30 keV and finish processing is performed at 10 keV is known (Patent Document 1). Also, a processing method is known in which a damage layer is effectively removed by lowering energy of an ion beam used for finish processing and by optimizing an incidence angle for a sample according to the shape of the sample (patent document 2). Also, in order to reduce the damage layer, it is known that an acceleration voltage of a focused ion beam device needs to be lowered (patent document 3). As described above, in processing using the focused ion beam device, it is well known that the acceleration voltage is lowered.

However, when lowering the acceleration voltage of the focused ion beam, an increase in the amount of beam blur due to chromatic aberration or the spread of beam profile due to Coulomb interaction becomes noticeable. As countermeasures against the increase in the amount of beam blur or the spread of beam profile, a beam booster technique is used (patent document 4, and non-patent document 1). In the beam booster technique, the potential energy of the middle portion of optics is raised, and then the potential energy is lowered by an objective lens.

It is also well known that the beam booster is used for the electron beam (patent document 5).

A composite charged particle beam apparatus is known in which the same point on the sample is irradiated with the electron beam and the focused ion beam (patent document 6). In the composite charged particle beam apparatus, it is required that the same point on the sample is irradiated with the electron beam and the focused ion beam and that the electron beams and the focused ion beams are focused on the same point on the sample. The same point on the sample irradiated with the electron beam and the focused ion beam is defined as a coincidence point (CP).

As a focused ion beam control method, it is disclosed that in accordance with the amount of the current of the ion beam, ion beam optical conditions, such as lens settings, a stigma correction value, the aperture diameter, applied voltage for beam alignment, applied voltage for the objective lens, and the like, and multiple processing contents are recorded on a computer; and optical conditions are selected and set according to the processing contents to perform multiple processing operations (patent document 7).

As control of the lens for the focused ion beam, it is disclosed that a focusing voltage table is generated, and based on the focusing voltage table, a focusing voltage is set such that a beam current value is adjusted to a reference value or an arbitrary value (patent document 8).

DOCUMENTS OF RELATED ART

Patent Documents (Patent Document 1) Japanese Patent Application Publication No. Hei. 11-223588
(Patent Document 2) Japanese Patent Application Publication No. 2007-193977
(Patent Document 3) Japanese Patent Application Publication No. 2009-272293
(Patent Document 4) Japanese Patent Application Publication No. 2007-103108
(Patent Document 5) Japanese Patent Application Publication No. 2000-173520
(Patent Document 6) Japanese Patent Application Publication No. 2006-236836
(Patent Document 7) Japanese Patent Application Publication No. Hei. 10-106474
(Patent Document 8) Japanese Patent Application Publication No. 2013-196826

Non-Patent Document (Non-patent Document 1) Michael Rauscher and Erich Plies, "Low Energy focused ion beam system design", Journal of Vacuum Science & Technology A, American Vacuum Society, 2006, 24(4), pp. 1055-1066

SUMMARY OF THE INVENTION

However, when using the beam booster in the focused ion beam device, the beam booster voltage limits the focal distance of the focused ion beam. By this limit, the focused ion beams are focused only above the sample, and thus a situation arises in which the focus may not be placed on the CP.

Figure 10:
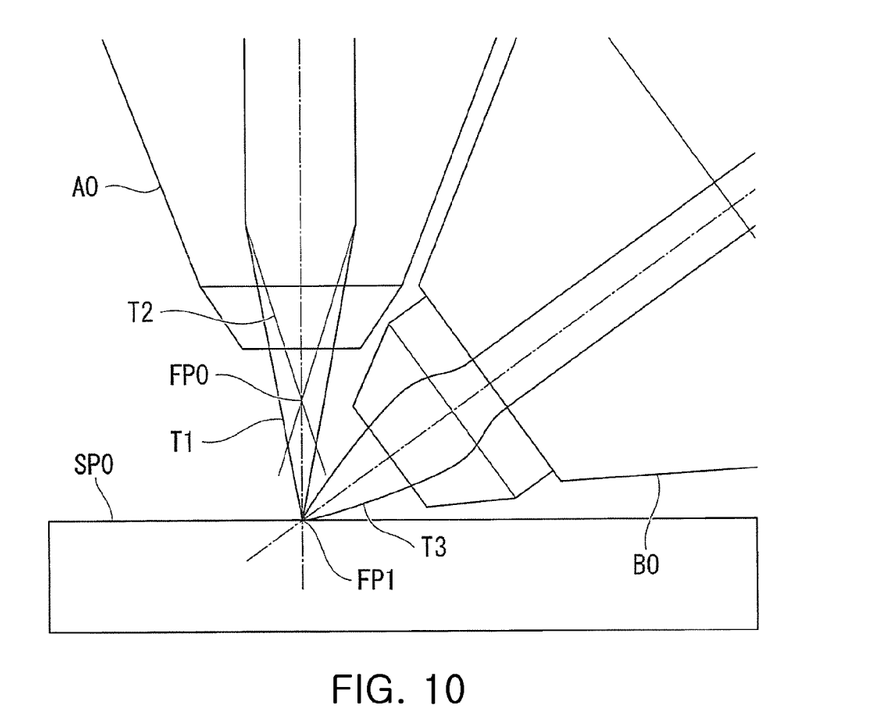
FIG. 10 is a diagram illustrating an example of beam trajectories in a conventional composite charged particle beam apparatus.

Here, with reference to FIG. 10, a situation where the focused ion beams may not be focused on the CP will be described. FIG. 10 is a diagram illustrating an example of beam trajectories in a conventional composite charged particle beam apparatus. In FIG. 10, a sample SP0 is irradiated with a focused ion beam from a focused ion beam column A0, and the sample SP0 is also irradiated with an electron beam from an electron beam column B0.

A beam trajectory T1 is the trajectory of the focused ion beam when the beam booster voltage is not applied. A beam trajectory T2 is the trajectory of the focused ion beam when the beam booster voltage is applied. A beam trajectory T3 is the trajectory of the electron beam.

When the beam booster voltage is not applied, the beam trajectories T1s are focused on a point FP1 on the surface of the sample SP0. Herein, the point FP1 is the CP and is also the focal point of the electron beams. In the meantime, when the beam booster voltage is applied, there is a case where the focused ion beams are not focused on the point FP1 and the beam trajectories T1s are focused on the point FP0 above the sample SP0. That is, when the beam booster voltage is applied to the focused ion beam, a situation occurs where the focused ion beams may not focused on the CP.

The limit on a range enabling the focusing which occurs when the beam booster is used to the focused ion beam varies depending on the acceleration voltage. Further, the limit on the range enabling the focusing which occurs when the beam booster is used varies depending on the voltage of the beam booster. Because of this, depending on the range of voltages of the beam booster, there is a case where the focal distance of the focused ion beams is not set to the CP. Under the condition of using the voltage of the beam booster in which the focal distance of the focused ion beams is not set to the CP, even though the applied voltage for the objective lens of the focused ion beam device and the lens strength are adjusted, it is difficult to place the focal point on the CP.

As described above, in the composite charged particle beam apparatus using the electron beam and the focused ion beam, such a problem arises when the focused ion beam column is provided with the beam booster and also when the working distance of the focused ion beam is longer than the working distance of the electron beam. In the case where the electron beam and the focused ion beam are intended to be emitted to the same point on the sample, the problem refers to the situation where the electron beams and the focused ion beams cannot be focused on the same point on the sample.

Application of the method disclosed in patent document 7 does not solve the problem. In patent document 7, there is no description of the beam booster for the focused ion beam and of the composite charged particle beam, and there is no CP. Because of this, it is impossible to deduce how the problem occurs and how to set the beam booster voltage.

Also, application of the method disclosed in patent document 8 does not solve the problem. In patent document 8, a target to be controlled is a focusing voltage of a condenser lens. Also, in patent document 8, it is intended to adjust the beam current by setting the focusing voltage. In patent document 8, there is no description of the beam booster for the focused ion beam and of the composite charged particle beam, and there is no CP. Because of this, it is impossible to deduce how the problem occurs and how to set the beam booster voltage.

Therefore, in the composite charged particle beam apparatus, when the focused ion beam column is equipped with the beam booster, it is required to be capable of setting the voltage of the beam booster according to a desired acceleration voltage for the focused ion beam.

Accordingly, at least one embodiment of the present disclosure has been made keeping in mind the above problems, and at least one embodiment of the present disclosure proposes a composite charged particle beam apparatus, and a control method thereof, the apparatus being capable of setting the value of the voltage of the beam booster according to a desired acceleration voltage for the focused ion beam.

In order to solve the problem and to achieve the objective, at least one embodiment of the present disclosure adopts the following aspects.

(1) According to one aspect of the present disclosure, a composite charged particle beam apparatus includes: an ion supply unit supplying an ion beam; an acceleration voltage application unit applying an acceleration voltage to the ion beam supplied by the ion supply unit to accelerate the ion beam; a first focusing unit focusing the ion beam accelerated by the acceleration voltage application unit; a beam booster voltage application unit applying a beam booster voltage to the ion beam focused by the first focusing unit; a second focusing unit focusing the ion beam to which the beam booster voltage is applied by the beam booster voltage application unit to irradiate a sample with the focused ion beam; an electron beam emission unit emitting an electron beam to irradiate the sample; and a controller setting a value of the beam booster voltage that the beam booster voltage application unit applies to the ion beam, based on a value of the acceleration voltage applied to the ion beam by the acceleration voltage application unit and a set value predetermined according to a focal distance of the focused ion beam.

In the composite charged particle beam apparatus according to the aspect described in (1) above, an irradiation point and a focus of the focused ion beams and an irradiation point of the electron beams are the same point on the sample.

(2) In the composite charged particle beam apparatus described in (1) above, the focused ion beams may be focused on a CP.

In the composite charged particle beam apparatus according to the aspect described in (2) above, within a range for the sample that may be observed by using the electron beam, the spread of the ion beams when the focused ion beams are accelerated by an acceleration voltage lower than a predetermined voltage may be limited by the beam booster, and a fine ion probe may be formed such that processing and observation are possible. In the composite charged particle beam apparatus according to the aspect described in (2) above, without adjusting the position of the sample stage, the same point on the sample may be observed by using the electron beam and processing and observation may be possible by using the focused ion beam with a beam booster function.

(3) In the composite charged particle beam apparatus described in (1) or (2) above, the controller may set, based on a set read from a storage that stores the set of the value of the acceleration voltage and the set value, the value of the beam booster voltage as the set value.

In the composite charged particle beam apparatus according to the aspect described in (3) above, a set of the value of the acceleration voltage and the value of the beam booster voltage may be read from the storage, and the value of the voltage of the beam booster may be limited according to the desired acceleration voltage for the focused ion beam and may be set within the range of limit.

(4) According to another aspect of the present disclosure, a control method of a composite charged particle beam apparatus including: an ion supply unit supplying an ion beam; an acceleration voltage application unit applying an acceleration voltage to the ion beam supplied by the ion supply unit to accelerate the ion beam; a first focusing unit focusing the ion beam accelerated by the acceleration voltage application unit; a beam booster voltage application unit applying a beam booster voltage to the ion beam focused by the first focusing unit; a second focusing unit focusing the ion beam to which the beam booster voltage is applied by the beam booster voltage application unit to irradiate a sample with the focused ion beam; and an electron beam emission unit emitting an electron beam to irradiate the sample, the method comprising: a control process setting, a value of the beam booster voltage that the beam booster voltage application unit applies to the ion beam, based on a value of the acceleration voltage applied to the ion beam by the acceleration voltage application unit and a set value predetermined according to a focal distance of the focused ion beam.

According to at least one embodiment of the present disclosure, it is possible to set the value of the voltage of the beam booster for the focused ion beam according to the desired acceleration voltage for the focused ion beam.

BRIEF DESCRIPTION OF THE DRAWINGS

The above and other objectives, features, and advantages of at least one embodiment of the present disclosure will be more clearly understood from the following detailed description taken in conjunction with the accompanying drawings, in which.

DESCRIPTION OF THE PREFERRED EMBODIMENTS

Embodiment

Figure 1:
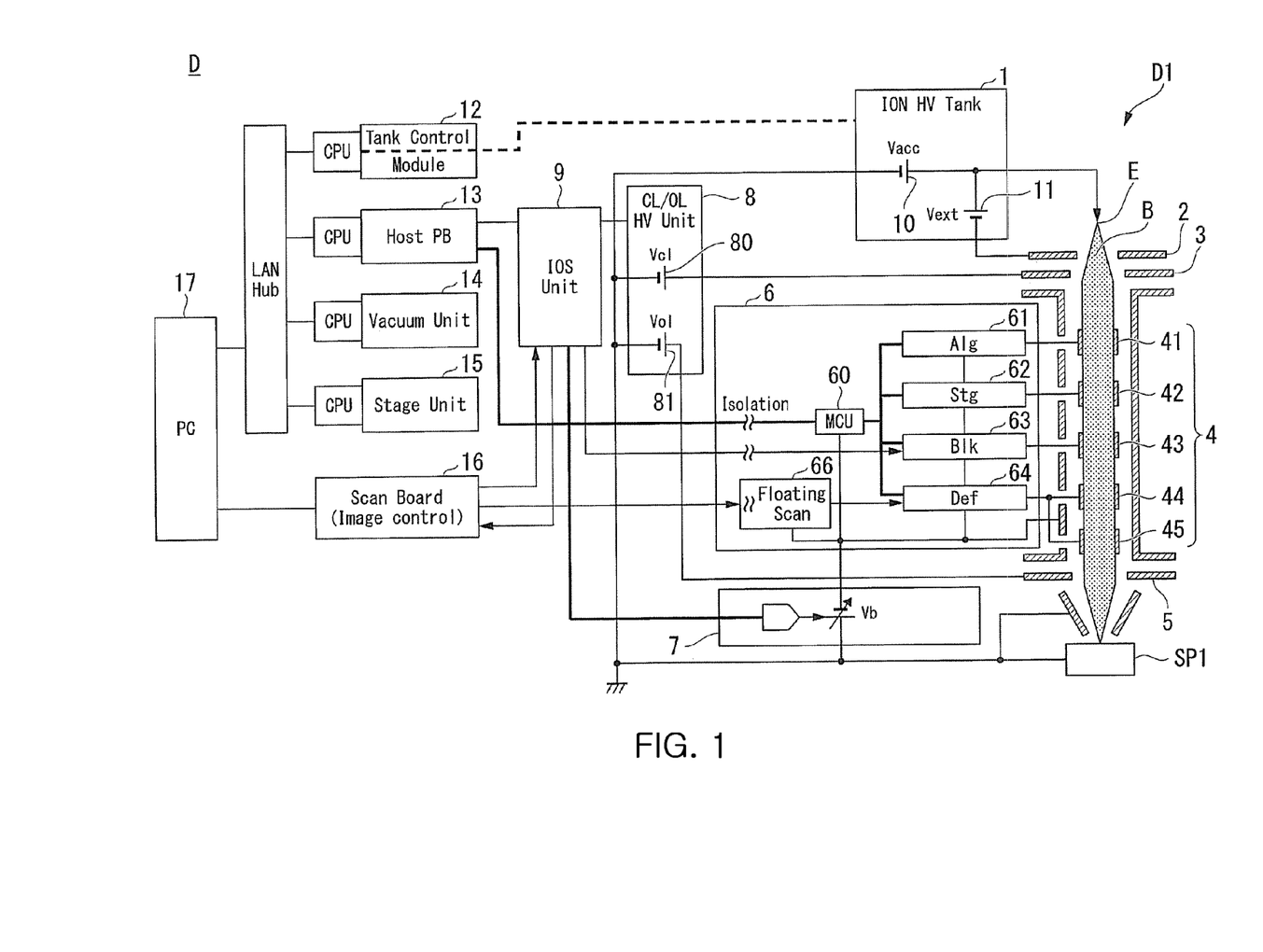
FIG. 1 is a diagram illustrating an example of a configuration of a composite charged particle beam apparatus according to an embodiment of the present disclosure.

Hereinafter, an embodiment of the present disclosure will be described in detail with reference to the accompanying drawings. FIG. 1 is a diagram illustrating an example of a configuration of a composite charged particle beam apparatus D according to the present embodiment.

The composite charged particle beam apparatus D includes a focused ion beam device D1, a beam booster controller 6, a beam booster power supply unit 7, a lens power supply unit 8, a controller 9, a tank control module 12, a host PB 13, a vacuum controller 14, a stage controller 15, a scan board 16, a personal computer (PC) 17, and a scanning electron microscope D2 (not shown).

The focused ion beam device D1 includes an ion source controller 1, an ion emitter E, an extraction electrode 2, a condenser lens 3, a beam booster 4, and an objective lens 5.

The focused ion beam device D1 applies an acceleration voltage Vacc to an ion beam B, and focuses the ion beam B using the condenser lens 3, the beam booster 4, and the objective lens 5 to irradiate a sample SP1 with the focused ion beam. The sample SP1 is placed during a grounded state.

The ion source controller 1 (an example of an ion supply unit) controls emission of the ion beam B as the charged particle beam. The ion source controller 1 includes an acceleration power supply 10 and an extraction power supply 11. The ion emitter E has a metal of which a front end is sharp, and the front end of the metal is, for example, a liquid metal ion source moistened with liquid metal gallium. Alternatively, instead of the liquid metal, gas such as helium, neon, oxygen, nitrogen, hydrogen, or the like may be supplied for a gas field ion source. Alternatively, as the charged particle supply unit, an inductively coupled plasma ion source or an electron cyclotron resonance plasma ion source may be used.

The extraction power supply 11 applies an extraction voltage Vext between the front end of the ion emitter E and the extraction electrode 2, thereby extracting gallium ions as charged particles from the front end.

The acceleration power supply 10 (an example of an acceleration voltage application unit) applies the acceleration voltage Vacc to the ion beam B supplied by the ion source controller 1 to accelerate the ion beam B. The acceleration voltage is, for example, up to 30 kV. However, in order to limit the damage to the sample caused by ion beam irradiation to a minimum, the acceleration voltage is set every processing step of the focused ion beam for use. For example, processing is performed by setting the acceleration voltage is to 30 kV for rough processing and setting the acceleration voltage to a low value of 1 kV or 0.5 kV for finish processing.

The condenser lens 3 (an example of a first focusing unit) focuses the ion beam B accelerated by the acceleration power supply 10. Herein, the condenser lens 3 focuses the passing ion beam B through means of an electric field that is formed by an application of a condenser lens voltage Vcl supplied from a condenser lens power supply 80 of the lens power supply unit 8.

The beam booster 4 (an example of a beam booster voltage application unit) applies the beam booster voltage Vb to the ion beam B focused by the condenser lens 3. The beam booster 4 is provided between the condenser lens 3 and the objective lens 5. The beam booster 4 raises the potential energy of the ion beam B that has passed through the condenser lens 3, thereby limiting an increase in the amount of beam blur due to chromatic aberration and/or the spread of beam profile due to Coulomb interaction. The beam booster 4 includes an alignment electrode 41, a stigma correction electrode 42, a blanking electrode 43, and a deflection electrode 44.

The alignment electrode 41 is connected to an alignment power supply 61 of the beam booster controller 6, and applies a voltage to the ion beams B so that misalignment of optical axes of the passing ion beams B is corrected.

The stigma correction electrode 42 is connected to a stigma power supply 62 of the beam booster controller 6, and applies a voltage to the ion beam B so that deformation of a cross-section shape of the passing ion beam B is corrected for formation in a round shape.

The blanking electrode 43 is connected to a blanking power supply 63 of the beam booster controller 6, and applies a voltage to the ion beam B so that the passing ion beam B is deflected not to irradiate the sample SP1.

The deflection electrode 44 is connected to a deflection power supply 64 of the beam booster controller 6, and applies a voltage to the ion beam B so that the passing ion beam B scans on the sample SP1.

The objective lens 5 (an example of a second focusing unit) focuses the ion beam B to which the beam booster 4 applies the beam booster voltage Vb to irradiate the sample SP1. Herein, the objective lens 5 focuses the passing ion beam B through means of an electric field that is formed by an application of an objective lens voltage Vol supplied from an objective lens power supply 81 of the lens power supply unit 8. Further, the objective lens 5 decelerates the ion beam B using the potential difference between the acceleration voltage Vacc and the objective lens voltage Vol.

The beam booster controller 6 controls the beam booster 4. The beam booster controller 6 includes a memory control unit (MCU) 60, the alignment power supply 61, the stigma power supply 62, the blanking power supply 63, the deflection power supply 64, and a high-voltage floating unit 66.

The MCU 60 controls the alignment power supply 61, the stigma power supply 62, the blanking power supply 63, and the deflection power supply 64 based on the beam booster voltage Vb set by the beam booster power supply unit 7.

The alignment power supply 61 applies a voltage to the alignment electrode 41. The stigma power supply 62 applies a voltage to the stigma correction electrode 42. The blanking power supply 63 applies a voltage to the blanking electrode 43. The deflection power supply 64 applies a voltage to the deflection electrode 44 and applies a voltage to a scanning electrode 45.

The high-voltage floating unit 66 is controlled by the scan board 16 and supplies a scanning signal to the deflection power supply 64. The scanning signal is a signal for adjusting a position where the sample SP1 is irradiated with the ion beam B. The high-voltage floating unit 66 and the scan board 16 constitute a scanning system SS. Details of the scanning system SS will be described later.

The beam booster power supply unit 7 is controlled by the controller 9 and sets the beam booster voltage Vb.

The lens power supply unit 8 includes the condenser lens power supply 80 and the objective lens power supply 81. The condenser lens power supply 80 applies a voltage to the condenser lens 3. The objective lens power supply 81 applies a voltage to the objective lens 5.

The controller 9 controls the beam booster power supply unit 7 based on an acceleration voltage value Eacc supplied from the PC 17. Herein, the acceleration voltage value Eacc is supplied from the PC 17 to the controller 9 through the host PB 13. Details of the controller 9 will be described later.

The PC 17 receives various types of manipulation from the user who uses the composite charged particle beam apparatus D. The PC 17 supplies an operation signal to the ion source controller 1 through the tank control module 12. The PC 17 supplies an operation signal to the beam booster controller 6 and the controller 9 through the host PB 13. Herein, the operation signal includes, for example, information indicating the acceleration voltage value Eacc that is the value of the acceleration voltage Vacc. Further, the PC 17 controls the vacuum controller 14 that controls a vacuum state of the composite charged particle beam apparatus D and the stage controller 15 that controls a stage on which the sample SP1 is placed.

The scanning electron microscope D2 (not shown, an example of an electron beam emission unit) emits an electron beam to the sample SP1 and detects secondary electrons or back-scattered electrons that are emitted from the sample SP1 to observe the surface or the cross section of the sample SP1.

Figure 2:
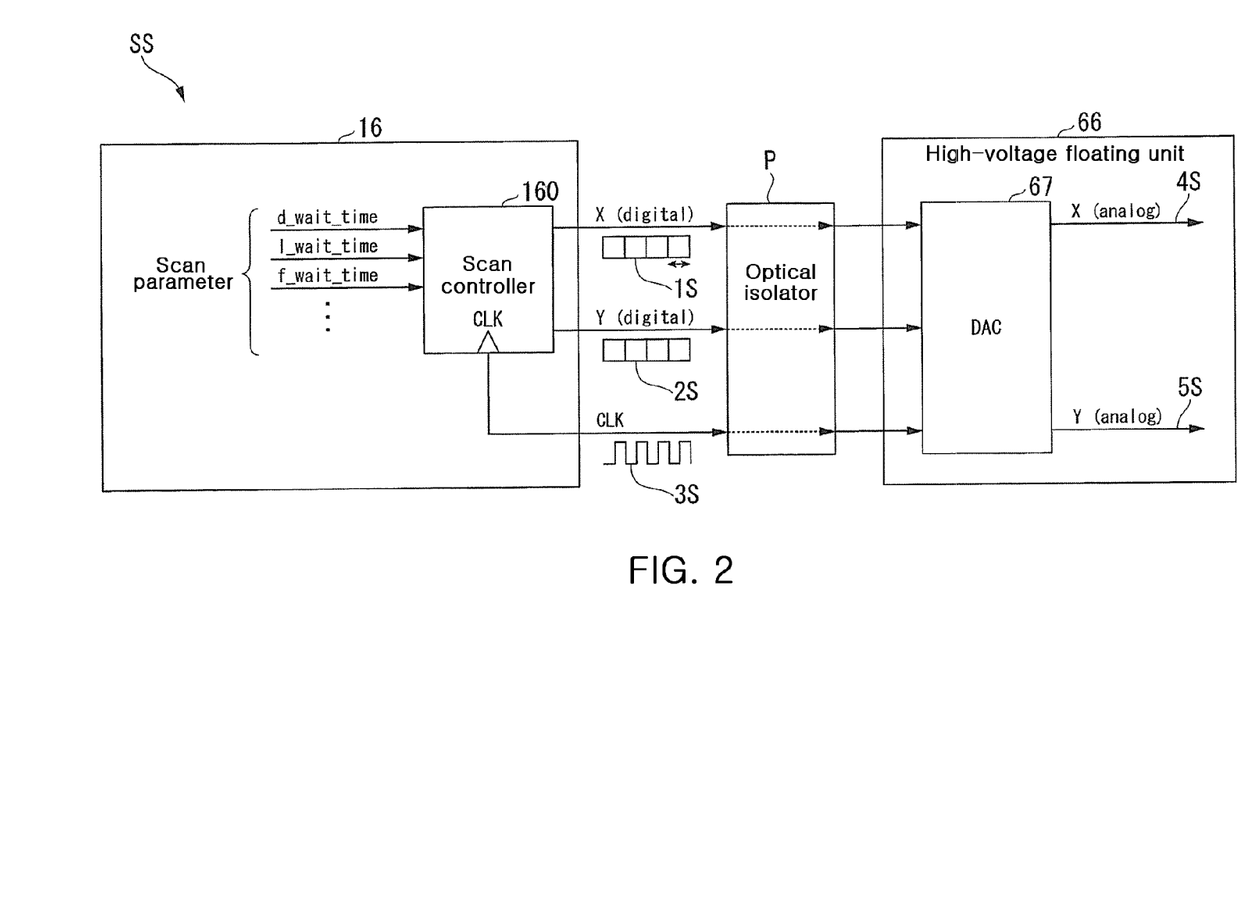
FIG. 2 is a diagram illustrating an example of isolation in a scanning system according to an embodiment of the present disclosure.

Herein, with reference to FIG. 2, isolation in the scanning system will be described. FIG. 2 is a diagram illustrating an example of isolation in the scanning system SS according to the present embodiment. The scanning system SS includes the scan board 16, the high-voltage floating unit 66, and an optical isolator P.

The scan board 16 includes a scan controller 160. The scan controller 160 supplies an X digital scanning signal 1S, a Y digital scanning signal 2S, which are digital scanning signals, and a CLK signal 3S to the high-voltage floating unit 66. Herein, the CLK signal 3S is used for synchronizing the X digital scanning signal 1S and the Y digital scanning signal 2S, and for synchronizing D/A conversion. The X digital scanning signal 1S, the Y digital scanning signal 2S, and the CLK signal are subjected to isolation by the optical isolator P, and then are supplied to the high-voltage floating unit 66. The optical isolator P is, for example, a photocoupler and is provided between the scan board 16 and the high-voltage floating unit 66.

The electric potential of the high-voltage floating unit 66 is the same as the electric potential of the beam booster which is a high voltage corresponding to the beam booster voltage Vb. The high-voltage floating unit 66 includes a D/A converter 67. Being synchronized with the CLK signal 3S, the D/A converter 67 converts the X digital scanning signal 1S into an X analog scanning signal 4S and converts the Y digital scanning signal 2S into a Y analog scanning signal 5S.

Further, instead of being provided between the scan board 16 and the high-voltage floating unit 66, the optical isolator P may be provided within the high-voltage floating unit 66; and, by means of an insulation amplifier or the like, the X analog scanning signal 4S and the Y analog scanning signal 5S that result from the conversion by the D/A converter 67 may be isolated.

Figure 3:
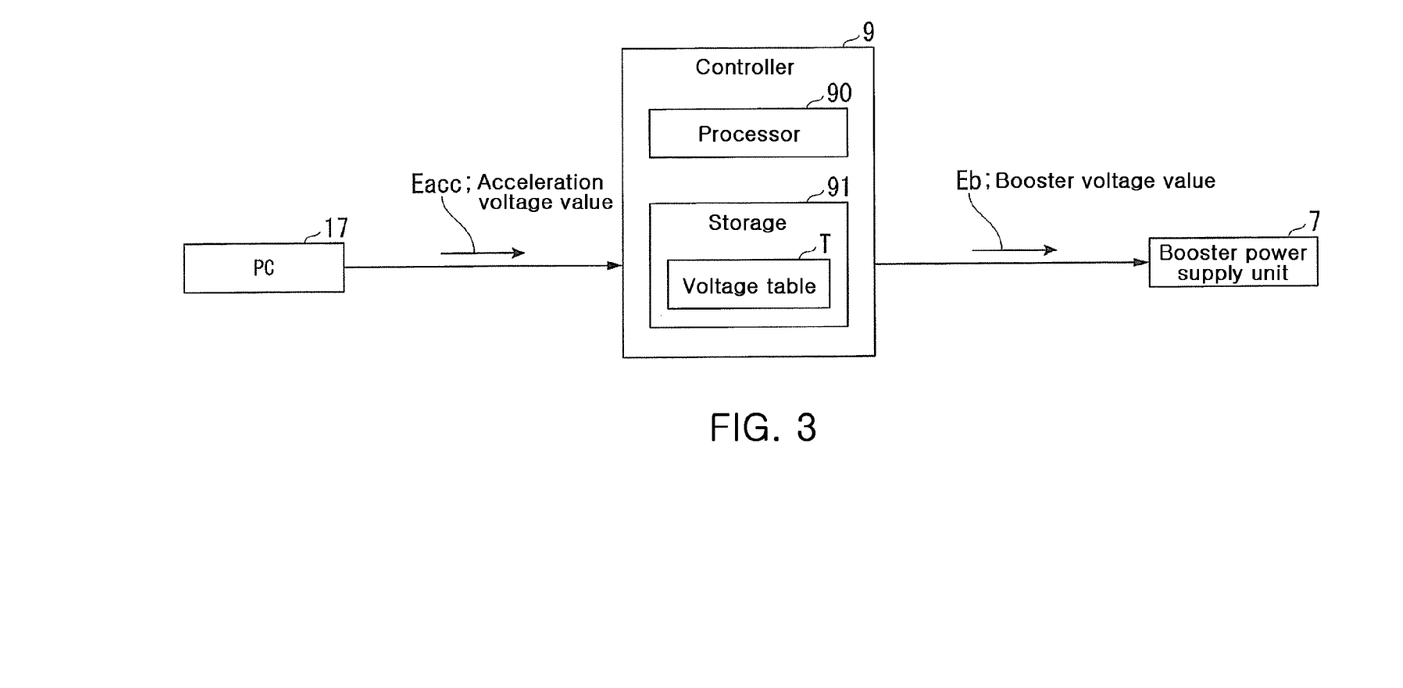
FIG. 3 is a diagram illustrating an example of a configuration of a controller according to an embodiment of the present disclosure.

Next, with reference to FIG. 3, details of the configuration of the controller 9 will be described. FIG. 3 is a diagram illustrating an example of the configuration of the controller 9 according to the present embodiment. The controller 9 includes a processor 90 and a storage 91.

The processor 90 calculates a beam booster voltage value Eb that is the value of the beam booster voltage Vb based on the acceleration voltage value Eacc supplied from the PC 17 and a voltage table T read from the storage 91. The processor 90 supplies the calculated beam booster voltage value Eb to the beam booster power supply unit 7.

Herein, the voltage table T is a table representing a set of an acceleration voltage value Eacc and a beam booster voltage set value TEb that is calculated previously according to a desired focal distance. The limit on a range of focal distances FB of the ion beams B which occurs when the beam booster 4 is used for the ion beams B varies with the acceleration voltage value Eacc. Also, a range enabling the focusing of the ion beams B varies with the beam booster voltage value Eb.

In the composite charged particle beam apparatus D, the voltage table T is a table including a previously-obtained combination of the acceleration voltage values Eacc and the beam booster voltage set values TEb that enable to focus both of the electron beam and the focused ion beam irradiated to the sample on the same point—namely, CP—of the irradiated sample with respect to the acceleration voltage value Eacc In the composite charged particle beam apparatus D, by setting the beam booster voltage set value TEb based on the voltage table T, the irradiation point and the focal point of the ion beams B and the irradiation point of the electron beams are the same point on the sample SP1.

The storage 91 stores the voltage table T. That is, the storage 91 stores the set of the acceleration voltage value Eacc and the beam booster voltage set value TEb. In the present embodiment, the storage 91 stores multiple sets of the acceleration voltage values Eacc and the beam booster voltage set values TEb as the voltage table T.

Figure 4:
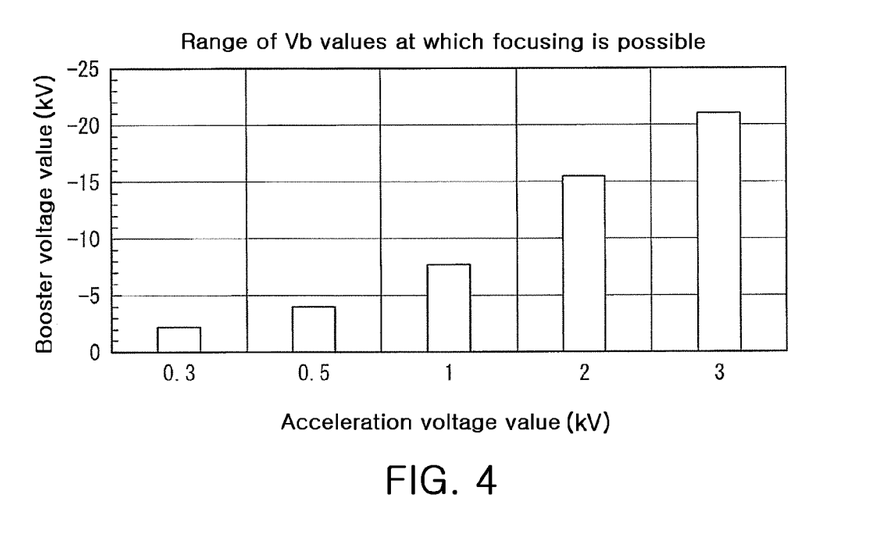
FIG. 4 is a diagram illustrating an example of a range of beam booster voltage values with respect to an acceleration voltage value according to an embodiment of the present disclosure.

Herein, with reference to FIG. 4, the range of the beam booster voltages Vb enabling the focusing will be described. FIG. 4 is a diagram illustrating an example of a range of the beam booster voltage values Eb with respect to the acceleration voltage value Eacc according to the present embodiment.

When the acceleration voltage Vacc is changed, the processor 90 changes the beam booster voltage value Eb to a voltage value that is equal to or smaller than the beam booster voltage set value TEb indicated by the voltage table T. That is, the voltage table T stores the beam booster voltage set value TEb presenting the upper limit of the beam booster voltage Vb. After setting the beam booster voltage value Eb, the voltage table T may store a set of the acceleration voltage value Eacc and the set beam booster voltage value Eb. The next time the beam booster voltage Vb is set, the processor 90 may use the stored beam booster voltage value Eb corresponding to the acceleration voltage value Eacc.

Figure 5:
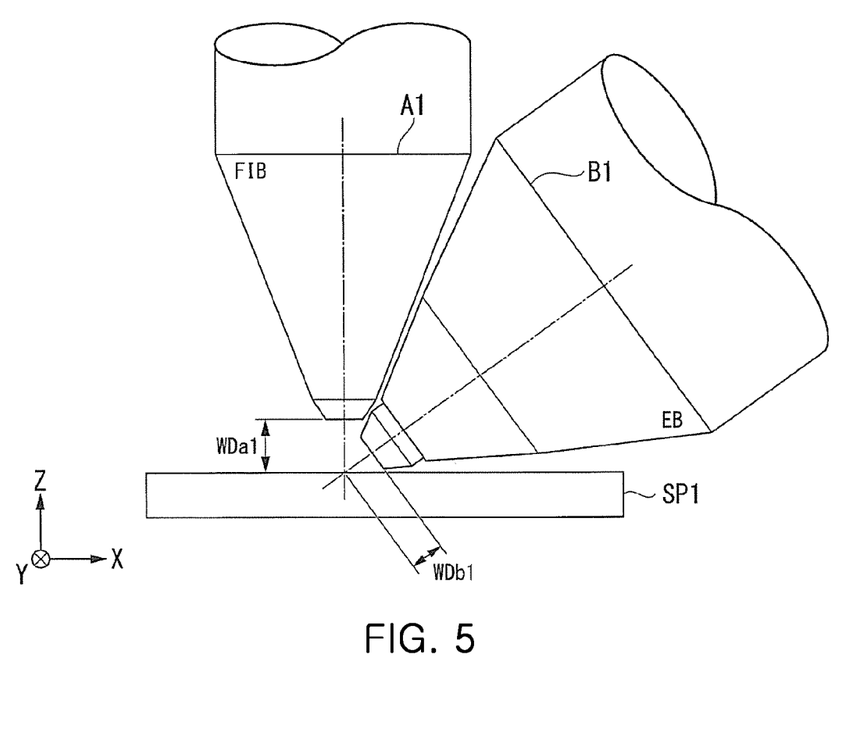
FIG. 5 is a diagram illustrating an example of an FIB working distance and an SEM working distance according to an embodiment of the present disclosure.

Herein, with reference to FIGS. 5 and 6, a relationship between an FIB working distance WDa1, which is the working distance of the focused ion beam device D1, and the beam booster voltage Vb will be described. FIG. 5 is a diagram illustrating an example of the FIB working distance WDa1 and an SEM working distance WDb1 according to the present embodiment.

The X axis and the Y axis are parallel to the horizontal plane and are perpendicular to each other. The Z axis refers to a vertical direction perpendicular to the X axis and the Y axis. In FIG. 5, a focused ion beam column A1 of the focused ion beam device D1 is provided in such a manner as to be parallel to the Z axis, namely, in a vertical direction. The ion beam B is emitted from the focused ion beam column A1 in the negative direction of the Z axis to irradiate the sample SP1.

In the meantime, an electron beam column B1 of the scanning electron microscope D2 is provided in such a manner as to be tilted at a predetermined angle with respect to the Z axis. Being tilted at the predetermined angle, the electron beam EB is emitted from the electron beam column B1 to irradiate the sample SP1. The predetermined angle is set, for example, in a range of 30° to 60° with respect to the horizontal plane.

Herein, the FIB working distance WDa1 is a distance between a front end of the focused ion beam column A1 and the surface of the sample SP1. The SEM working distance WDb1 is a working distance of the scanning electron microscope D2 and is a distance between a front end of the electron beam column B1 and the surface of the sample SP1.

In order to secure the image resolution of the scanning electron microscope D2, the FIB working distance WDa1 is longer than the SEM working distance WDb1. The FIB working distance WDa1 is set, for example, in a range of 8 to 16 mm. The SEM working distance WDb1 is set, for example, in a range of 2 to 7 mm.

Figure 6:
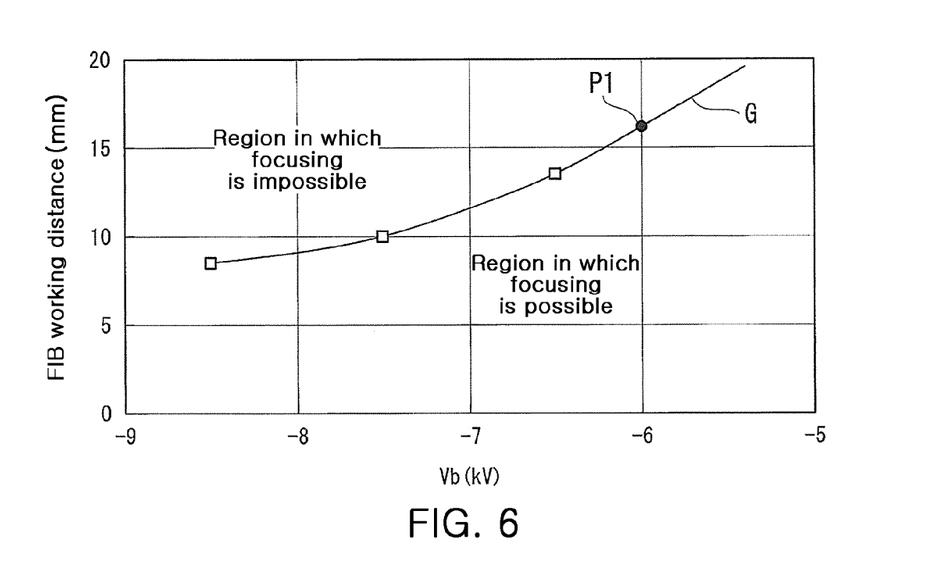
FIG. 6 is a diagram illustrating an example of a relationship between an FIB working distance and a beam booster voltage according to an embodiment of the present disclosure.

FIG. 6 is a diagram illustrating an example of a relationship between the FIB working distance WDa1 and the beam booster voltage Vb according to the present embodiment.

The graph G is a graph showing the FIB working distance WDa1 at which the focusing on the CP is possible, with respect to the value of the beam booster voltage Vb (the beam booster voltage value Eb) when the acceleration voltage is 1 kV. The upper left region of the graph G corresponds to the FIB working distance WDa1 in which the focusing is impossible, and the lower right region of the graph G corresponds to the FIB working distance WDa1 in which the focusing is possible. That is, the graph G shows the boundary of whether the focusing on the CP is possible or impossible. According to the graph G, as the absolute value of the beam booster voltage Vb increases, the FIB working distance WDa1 in which the focusing is possible decreases.

For example, taking note of the point P1, in the case where the FIB working distance WDa1 is 16 mm, in order to make the focusing possible, it is found that the absolute value of the beam booster voltage Vb needs to be 6 kV or less.

Figure 7:
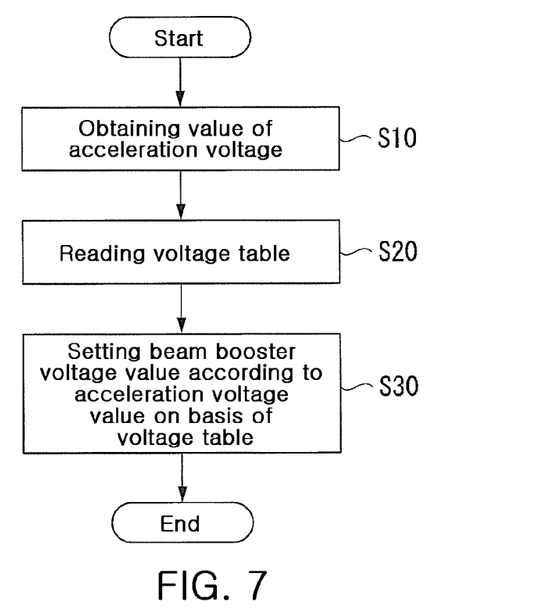
FIG. 7 is a diagram illustrating an example of a process of setting a beam booster voltage value according to an embodiment of the present disclosure.

Herein, with reference to FIG. 7, a process of setting the beam booster voltage value Eb by the controller 9 will be described. FIG. 7 is a diagram illustrating an example of a process of setting the beam booster voltage value Eb according to the present embodiment.

At step S10: the processor 90 acquires the acceleration voltage value Eacc from the PC 17.

At step S20: the processor 90 reads the voltage table T from the storage 91.

At step S30: the processor 90 sets, based on the read voltage table T, the beam booster voltage value Eb according to the acceleration voltage value Eacc. Herein, the processor 90 calculates, as the beam booster voltage value Eb based on the voltage table T, the beam booster voltage value Eb that is equal to or smaller than, by a predetermined value, the beam booster voltage set value TEb corresponding to the acceleration voltage value Eacc. The processor 90 supplies the calculated beam booster voltage value Eb to the beam booster power supply unit 7 so that the beam booster voltage value Eb is set.

Accordingly, the controller 9 sets the acceleration voltage value Eacc that is the value of the acceleration voltage Vacc that the acceleration power supply 10 applies to the ion beam B and the beam booster voltage value Eb that is the value of the beam booster voltage Vb that the beam booster 4 applies to the ion beam B, based on the beam booster voltage set value TEb that is a set value predetermined according to the focal distance FB of the ion beam B.

Herein, the voltage table T is the set of the acceleration voltage value Eacc and the beam booster voltage set value TEb. Therefore, the controller 9 sets, based on the set read from the storage 91 that stores the sets of the acceleration voltage values Eacc and the beam booster voltage set values TEb, the beam booster voltage value Eb as the beam booster voltage set value TEb.

Further, in the present embodiment, the case where the controller 9 includes the storage 91 is described, but no limitation thereto is imposed. The storage 91 may be provided outside the composite charged particle beam apparatus D. In the case where the storage 91 is provided outside the composite charged particle beam apparatus D, for example, the storage 91 is provided as an external storage device or a cloud server.

Also, instead of the storage 91 storing the voltage table T, the storage 91 may store an operation expression for calculating the beam booster voltage value Eb from the acceleration voltage value Eacc, and the controller 9 may calculate and set the beam booster voltage value Eb based on the operation expression.

Also, in the present embodiment, although the case where the focused ion beam column A1 is provided in the vertical direction and the electron beam column B1 is provided in such a manner as to be tilted at a predetermined angle with respect to the vertical direction is described, no limitation thereto is imposed.

Herein, with reference to FIGS. 8 and 9, a modification of the arrangement of the focused ion beam column A1 and the electron beam column B1 will be described.

Figure 8:
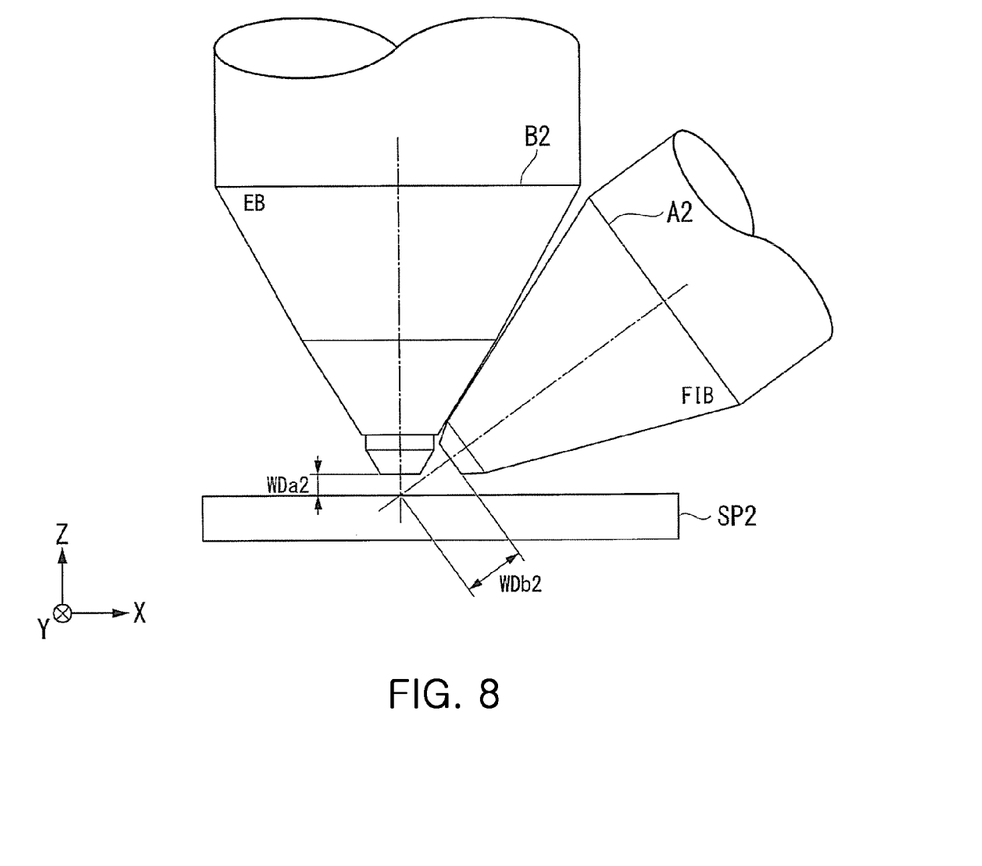
FIG. 8 is a diagram illustrating a first example of an arrangement of a focused ion beam column and an electron beam column according to a modification to the embodiment of the present disclosure.

FIG. 8 is a diagram illustrating a first example of an arrangement of a focused ion beam column A2 and an electron beam column B2 according to the modification to the present embodiment. In FIG. 8, the focused ion beam column A2 is provided in such a manner as to be tilted at a predetermined angle with respect to the Z axis. Being tilted at the predetermined angle, the ion beam B is emitted from the focused ion beam column A2 to irradiate the sample SP2.

In the meantime, the electron beam column B2 is provided in such a manner as to be parallel to the Z axis, namely, in a vertical direction. The electron beam EB is emitted from the electron beam column B2 in the negative direction of the Z axis to irradiate the sample SP2.

An FIB working distance WDa2 is longer than an SEM working distance WDb2.

Figure 9:
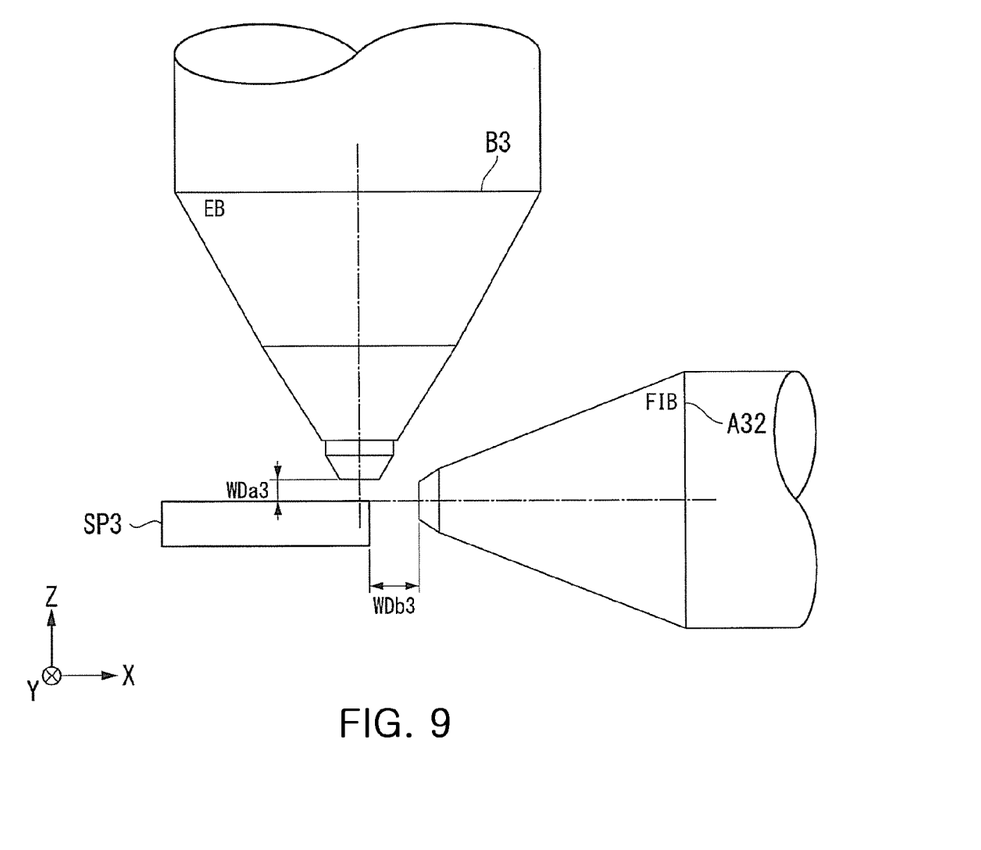
FIG. 9 is a diagram illustrating a second example of an arrangement of a focused ion beam column and an electron beam column according to a modification to the embodiment of the present dislosure.

FIG. 9 is a diagram illustrating a second example of an arrangement of a focused ion beam column A3 and an electron beam column B3 according to a modification to the present embodiment. In FIG. 9, the focused ion beam column A3 is provided in such a manner as to be parallel to the X axis, namely, in a horizontal direction. The ion beam B is emitted from the focused ion beam column A2 in the negative direction of the X axis to irradiate the sample SP3.

In the meantime, the electron beam column B3 is provided in such a manner as to be parallel to the Z axis, namely, in a vertical direction. The electron beam EB is emitted from the electron beam column B3 in the negative direction of the Z axis to irradiate the sample SP3.

An FIB working distance WDa3 is longer than an SEM working distance WDb3.

As described above, in the composite charged particle beam apparatus D according to the present embodiment, the value of the beam booster voltage Vb (the beam booster voltage value Eb) of the beam booster 4 in which the focusing of the focused ion beams on the CP is possible may be set according to a desired acceleration voltage for the charged particle beam (ion beam B).

The effect of the embodiment of the present disclosure will be described taking an example of making a lamella sample for a transmission electron microscope by using a gallium (Ga) focused ion beam. Processing is performed in the following three steps.

(1) Rough Processing

Under the condition that the acceleration voltage of the focused ion beam is 30 kV and the beam current is 10 nA, processing of the peripheral part of the lamella is performed. It is well known that the peripheral part of the lamella is subjected to processing with a high acceleration voltage and a high current under the condition that the processing rate is high (patent document 1). At the acceleration voltage of 30 kV, beam blur caused by chromatic aberration or Coulomb interaction is not noticeable, so that the set voltage of the beam booster is set to 0 V. By this rough processing, the lamella is cut in with the width of up to 0.7 μm. The width of the lamella is checked by observing the progress of the processing in substantially real time, based on the scanning electron microscope image obtained using the electron beams that irradiate the point the same as the lamella-processing part. However, since the acceleration voltage is 30 kV, the damage layer having the depth of 25 nm is formed in a Si layer by Ga injection and collision cascade between atoms. From each surface of the both surfaces of the lamella, the damage layer having the depth of 25 nm is formed.

(2) Intermediate Processing

Under the condition that the acceleration voltage of the focused ion beam is 1 kV and the beam current is 200 pA, the damage layer formed by the above-described rough processing is subjected to etching. Herein, to make the thickness of the newly formed damage layer as thin as possible, the acceleration voltage is lowered and processing is performed. At the acceleration voltage of 1 kV, beam blur caused by chromatic aberration or Coulomb interaction is noticeable, so that the set voltage of the beam booster is set to −7 kV with reference to FIG. 4. By this intermediate processing, the lamella is cut in with the width of up to 0.3 μm. In the same manner as the rough processing, the width of the lamella is checked by observing the progress of the processing in substantially real time, based on the scanning electron microscope image obtained using the electron beams that irradiate the point the same as the lamella-processing part. However, the acceleration voltage is 1 kV, the damage layer having the depth of 3 nm is formed in the Si layer by Ga injection and collision cascade between atoms. From each surface of the both surfaces of the lamella, the damage layer having the depth of 3 nm is formed.

(3) Finish Processing

Under the condition that the acceleration voltage of the focused ion beam is 0.5 kV and the beam current is 50 pA, the damage layer formed by the above-described intermediate processing is subjected to etching so as to make the damage layer thin and to finish the lamella thinly. Herein, to make the thickness of the newly formed damage layer as thin as possible, the acceleration voltage is much lowered and processing is performed. At the acceleration voltage of 0.5 kV, beam blur caused by chromatic aberration or Coulomb interaction is more noticeable, so that the set voltage of the beam booster is set to −4 kV with reference to FIG. 4. Herein, in the case of not using the beam booster setting method according to at least one embodiment of the present disclosure, for example, when being set to −7 kV equal to the set voltage of the beam booster which is the condition of the above-described intermediate finishing, it is impossible to focus the focused ion beams on the lamella sample. By this finish processing, the lamella is cut in with the width of up to 0.1 μm(=100 nm). In the same manner as the above-described processing, the width of the lamella is checked by observing the progress of the processing in substantially real time, based on the scanning electron microscope image obtained using the electron beams that irradiate the point the same as the lamella-processing part. However, since the acceleration voltage is 0.5 kV, the damage layer having the depth of 2 nm is formed in the Si layer by Ga injection and collision cascade between atoms. From each surface of the both surfaces of the lamella, the damage layer having the depth of 2 nm is formed.

As a result of the above-described procedure, the lamella having the thickness of 0.1 μm (=100 nm) and the damage layer of 4 nm (2 nm×2) on the thin film surface is obtained. The thickness of the damage layer to the thickness of the lamella is 4/100 (=4%), and high-quality lamella processing is possible.

As described above, in general, in the composite charged particle beam apparatus, the focused ion beams are required to be focused on the CP. In the composite charged particle beam apparatus D according to the present embodiment, the voltage table T is a table including a previously-obtained combination, at which the focusing on the CP is possible, of the acceleration voltage value Eacc and the beam booster voltage set value TEb. According to the desired acceleration voltage for the focused ion beam, the value of the beam booster voltage Vb (the beam booster voltage value Eb) at which the focusing on the CP is possible may be set.

Note that, in the scanning electron microscope equipped with the beam booster, there is a problem that the focal position of the electron beams is limited due to the application of the booster voltage. However, for the electron beam, the working distance is short, and thus this problem does not come to the fore. Even in the focused ion beam, when the working distance of the focused ion beam is short, this problem does not come to the fore. However, in the composite charged particle beam apparatus, due to the arrangement with the scanning electron microscope, the working distance of the focused ion beam is longer than the working distance of the electron beam. As described above, this is to ensure the phase resolution of the scanning electron microscope.

The composite charged particle beam apparatus D according to the above-described embodiment is provided with two types of charged particle beams that are the focused ion beams and the electron beams. In the case of the composite charged particle beam apparatus D further using a third charged particle beam such as an argon ion beam, or the like, when three types of charged particle beams are configured to possibly irradiate the same point on the sample, the booster voltage of the focused ion beam is controlled in the same manner as described above, whereby according to the desired acceleration voltage for the focused ion beam, the value (the beam booster voltage value Eb) of the beam booster voltage Vb at which the focusing on the CP is possible may be set.

In the case where the three types of charged particle beams cannot focused on the same point on the sample, for example, the same irradiation point CP1 on the sample with respect to the focused ion beam and the electron beam is defined, and the same irradiation point CP2 on the sample with respect to the focused ion beam and the argon ion beam is defined. The respective corresponding voltage tables T-1 and T-2 are prepared to set the beam booster voltage Vb of the focused ion beam. In the process of irradiating the sample with the focused ion beam and the electron beam, the voltage table T-1 is used to set the beam booster voltage Vb of the focused ion beam. In the process of irradiating the sample with the focused ion beam and the argon ion beam, the voltage table T-2 is used to set the beam booster voltage Vb of the focused ion beam.

Further, when the charged particle beams increase in number, the above method is expanded to prepare a corresponding voltage table T-n, thereby setting the value (the beam booster voltage value Eb) of the beam booster voltage Vb at which the focusing on the CPn is possible.

Further, a part of the composite charged particle beam apparatus D according to the above-described embodiment, for example, the controller 9 may be implemented by a computer. In this case, this configuration may be implemented by recording a program for enabling such control functions on a computer-readable recording medium and causing a computer system to read the program recorded on the recording medium for execution. Further, it is noted that the "computer system" herein refers to a computer system built into the composite charged particle beam apparatus D and includes an OS or hardware, such as a peripheral device, or the like. Furthermore, the "computer-readable recording medium" refers to a portable medium such as a flexible disk, a magneto-optical disk, a ROM, a CD-ROM, or the like; or a storage device such as a hard disk built in to the computer system, or the like. Moreover, the "computer-readable recording medium" may include a medium for dynamically holding a program for a short period of time, such as a communication line that is used to transmit the program over a network such as the Internet or over a communication circuit such as a telephone circuit, and a medium for holding, in such a case, a program for a fixed period of time, such as a volatile memory within a computer system that functions as a server or a client. Furthermore, the program may be configured to implement some of the functions described above, and may also be configured to implement the functions described above in combination with a program already recorded in a computer system.

Furthermore, a part or the entire of the controller 9 according to the above-described embodiment may be implemented as an integrated circuit such as a large-scale integration (LSI), or the like. Functional blocks of the controller 9 may be individually implemented as processors, or a part or all thereof may be integrated and implemented as a processor. Furthermore, the technique for being implemented as an integrated circuit is not limited to the LSI, and the implementation with a dedicated circuit or a general-purpose processor is possible. Furthermore, in a case where advances in the semiconductor technology enable the implementation as an integrated circuit that can replace the LSI, such an advanced integrated circuit may be applicable.

Although the embodiment of the present disclosure has been described in detail with reference to the accompanying drawings, the detailed configuration is not limited to what has been described above, and various design modifications may be made without departing from the scope of the present disclosure.

What is claimed is:

1. A composite charged particle beam apparatus comprising:
   an ion supply unit supplying an ion beam;
   an acceleration voltage application unit applying an acceleration voltage to the ion beam supplied by the ion supply unit to accelerate the ion beam;
   a first focusing unit focusing the ion beam accelerated by the acceleration voltage application unit;
   a beam booster voltage application unit applying a beam booster voltage to the ion beam focused by the first focusing unit;
   a second focusing unit focusing the ion beam to which the beam booster voltage is applied by the beam booster voltage application unit to irradiate a sample;
   an electron beam emission unit emitting an electron beam to irradiate the sample; and
   a controller setting a value of the beam booster voltage that the beam booster voltage application unit applies to the ion beam, based on a value of the acceleration voltage applied to the ion beam by the acceleration voltage application unit and a set value predetermined according to a focal distance of the focused ion beam.

2. The composite charged particle beam apparatus of claim 1, wherein an irradiation point and a focal point of the focused ion beam and an irradiation point of the electron beam are the same point on the sample.

3. The composite charged particle beam apparatus of claim 1, wherein the controller sets, based on a set read from a storage that stores the set of the value of the acceleration voltage and the set value, the value of the beam booster voltage as the set value.

4. The composite charged particle beam apparatus of claim 2, wherein the controller sets, based on a set read from a storage that stores the set of the value of the acceleration voltage and the set value, the value of the beam booster voltage as the set value.

5. A control method of a composite charged particle beam apparatus including:
   an ion supply unit supplying an ion beam;
   an acceleration voltage application unit applying an acceleration voltage to the ion beam supplied by the ion supply unit to accelerate the ion beam;
   a first focusing unit focusing the ion beam accelerated by the acceleration voltage application unit;
   a beam booster voltage application unit applying a beam booster voltage to the ion beam focused by the first focusing unit;
   a second focusing unit focusing the ion beam to which the beam booster voltage is applied by the beam booster voltage application unit to irradiate a sample; and
   an electron beam emission unit emitting an electron beam to irradiate the sample,
   the method comprising:
      a control process setting, a value of the beam booster voltage that the beam booster voltage application unit applies to the ion beam, based on a value of the acceleration voltage applied to the ion beam by the acceleration voltage application unit and a set value predetermined according to a focal distance of the focused ion beam.

\* \* \* \* \*